June 28, 1960 N. C. JOEHLIN 2,943,310

PULSE CODE TRANSLATOR

Filed May 18, 1955

PULSE POSITION OF BINARY CODE

| DIGITS | 8 | 4 | 2 | 1 |
|---|---|---|---|---|
| 1 | o | o | o | x |
| 2 | o | o | x | o |
| 3 | o | o | x | x |
| 4 | o | x | o | o |
| 5 | o | x | o | x |
| 6 | o | x | x | o |
| 7 | o | x | x | x |
| 8 | x | o | o | o |
| 9 | x | o | o | x |
| 10 | x | o | x | o |
| 11 | x | o | x | x |
| 12 | x | x | o | o |
| 13 | x | x | o | x |
| 14 | x | x | x | o |
| 15 | x | x | x | x |

INVENTOR
NORMAN C. JOEHLIN
BY Percy P. Lantzy
ATTORNEY

United States Patent Office 2,943,310
Patented June 28, 1960

2,943,310

PULSE CODE TRANSLATOR

Norman C. Joehlin, Plymouth, Mich., assignor to International Telephone and Telegraph Corporation, Nutley, N.J., a corporation of Maryland Filed May 18, 1955, Ser. No. 509,328

3 Claims. (Cl. 340—347)

Figures 1, 2:
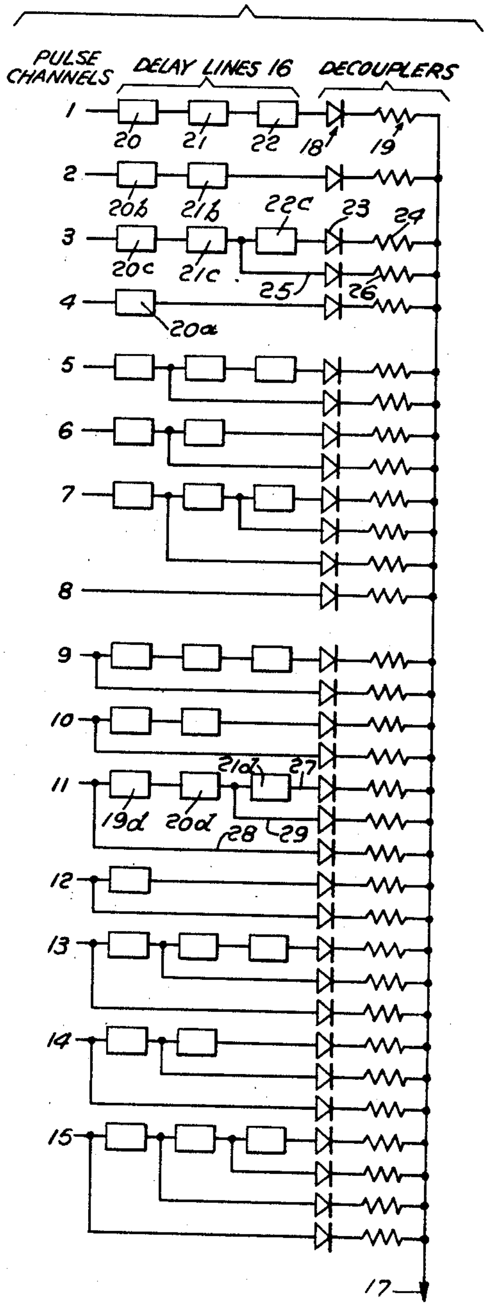

This invention relates to pulse code translators and more particularly to a new system for translating pulses from digitally representative pulse channels into pulse code combinations.

In known electronic switching systems, having switching functions controlled by decimal pulse code selection, the coincident switching gates are relatively simple. The space requirement of time displaced decimal pulses in recirculating storage devices is, however, excessive as compared to pulse code combinations. For example, in electronic switching systems controlled by decimal code selections, each line is identified by pulses distributed on digital pulse channels, which are converted into time position pulses for storage in regenerating memory devices. Each decimal digit thus requires ten storage positions and necessitates the use of comparatively large and complex storage devices. A switching system of the type mentioned above is disclosed in the U.S. Patent 2,766,327, isued October 9, 1956, by Arnold Lesti.

It is an object of this invention to provide novel means for translating pulses from digitally representative pulse channels into pulse code combinations. Such a translation means when used in electronic switching systems reduces measurably the storage space required for a given number of lines.

It is a feature of this invention to supply each digital pulse channel with a translation network by which pulses may be applied to a common storage device as a pulse code combination representative of the particular pulse channel. The translation network may include one or several delay devices coupled in different combinations so that a particular code may be sequentially applied to the storage device.

The above and other objects and features of this invention will become more apparent by reference to the following description and the accompanying drawings, wherein:

Fig. 1 shows a schematic circuit diagram illustrating the principles of my invention applied to one type of binary code translator system; and, Fig. 2 shows a table useful in explaining the operation of the system illustrated in Fig. 1.

A system for translating pulses from digitally representative pulse channels into pulse code combinations is illustrated in Fig. 1 wherein fifteen pulse channels are illustrated. Channels 1 to 10 represent corresponding decimal digits and channels 11 to 15 may be used for special codes, such as toll and busy. Pulses may be supplied to these channels one at a time with a minimum spacing between pulses.

The channels are provided with appropriate networks which may or may not include parts of a delay line 16 coupled to an outlet 17 via decoupling rectifiers 18 and resistors 19. A pulse from any pulse channel is translated to a pulse code of one or more pulses distributed in a given number of pulse positions. Fig. 2 shows a four digit binary code where each decimal digit corresponds to a different pulse code combination, as indicated by crosses. The pulse positions 8, 4, 2 and 1 represent the transmission timing for the pulses of the code. Consecutive pulses in a code combination are separated by a certain unit of delay, with a maximum delay of three units provided for the pulse of position 1. The pulse for position 8 is transmitted with a minimum or no delay.

By referring to Fig. 1 pulse channel 1 is shown to have a delay line having three units 20, 21 and 22. Each unit has the delay required for the spacing of adjacent pulse positions. A pulse supplied to this channel is transmitted to the outlet 17 with a maximum delay corresponding to pulse position 1 as illustrated in Fig. 2. Pulse channel 4 is provided with one delay unit 20*a*. A pulse on this channel is transmitted with one unit of delay corresponding to pulse position 4. Pulse channel 2 is provided with two units delay 20*b* and 21*b* and a pulse in this channel is transmitted in pulse position 2. Pulse channel 8 is without any delay line, as a consequence a pulse in this channel is transmitted in pulse position 8 with a minimum or no delay.

A number of the combinations shown in Fig. 2 provide two or more pulses in the pulse positions of the binary code. For example the pulse channel 3 provides pulses in pulse positions 1 and 2. The circuitry required for this type of translation as shown in Fig. 1 utilizes three units of a delay line 20*c*, 21*c* and 22*c* series coupled to outlet 17 via a decoupling rectifier 23 and a resistance 24. A parallel branch is provided via decoupling rectifier 25 and resistor 26. A pulse supplied to channel 3 is directed by the parallel branches respectively to the rectifiers 23 and 25 and is applied to outlet 17 in the two different pulse positions indicated in Fig. 2. That is the pulse applied to rectifier 25 will be delayed by the two units 20*c* and 21*c* for pulse position 2, while the pulse applied to rectifier 23 will be delayed by the three units 20*c*, 21*c* and 22*c* for pulse position 1.

A pulse from channel 11 will in a similar manner be distributed via the parallel branches 27, 28 and 29 and the resulting pulses transmitted in pulse positions 1, 2 and 8.

From the foregoing description it is believed clear that I have provided a simple pulse code translator for translating pulses from digitally representative pulse channels into pulse code combinations.

While I have described above the principles of my invention in connection with specific apparatus, it is to be clearly understood that this description is made only by way of example and not as a limitation to the scope of my invention.

I claim:

1. A system for translating pulses applied to any one of a plurality of input channels, each one of which has a decimal value, into pulse combinations having binary decimal code values representative of the decimal value of the input channel to which a pulse is applied comprising a plurality of input channels each having a decimal value, a plurality of circuit means, each circuit means coupled to one of said input channels and including a predetermined number of electronic delay line units coupled in series, said predetermined number being from zero to a number which is one number less than the number of elements of said binary decimal code, a common output channel, a plurality of decoupling units coupled in parallel to said common output channel, and conductor means connecting respectively each of said decoupling units to a selected point on an associated one of said circuit means to provide for translation of a pulse applied to any one of said input channels into a pulse combination representative of the decimal value of said output channel.

2. A system for translating pulses applied to any one of a plurality of input channels, each one of which has a decimal value, into pulse combinations having binary decimal code values representative of the decimal value of the input channel to which a pulse is applied comprising a plurality of input channels each having a decimal value, a plurality of circuit means, each circuit means coupled to one of said input channels and including a predetermined number of electronic delay line units coupled in series and a plurality of points disposed therealong such that there is one point for each number of code output pulses to be produced representative of the decimal value of the input channel coupled thereto, said predetermined number being from zero to a number which is one number less than the number of elements of said binary decimal code, a common output channel, a plurality of decoupling units coupled in parallel to said common output channel, and conductor means connecting respectively each of said decoupling units to a selected one of said points on an associated one of said circuit means to provide for translation of a pulse applied to any one of said input channels into a pulse combination representative of the decimal value of said input channel.

3. A system for translating pulses applied to any one of a plurality of input channels, each one of which has a decimal value, into pulse combinations having binary decimal code values representative of the decimal value of the input channel to which a pulse is applied comprising a plurality of input channels each having a decimal value, a plurality of circuit means, each circuit means coupled to one of said input channels and including a predetermined number of electronic delay line units coupled in series and a plurality of taps disposed therealong such that there is one tap for each number of code output pulses to be produced representative of the decimal value of the input channel coupled thereto, said predetermined number being from zero to a number which is one number less than the number of elements of said binary decimal code, a common output channel, a plurality of decoupling units coupled in parallel to said common output channel, and conductor means connecting each of said decoupling units to a selected one of said taps on an associated one of said circuit means to provide for translation of a pulse applied to any one of said input channels into a pulse combination representative of the decimal value of said input channel.

References Cited in the file of this patent

UNITED STATES PATENTS

| | | |
|---|---|---|
| 2,495,740 | Labin et al. | Jan. 31, 1950 |
| 2,628,277 | Spencer | Feb. 10, 1953 |
| 2,641,698 | Gloess et al. | June 9, 1953 |
| 2,657,856 | Edwards | Nov. 3, 1953 |
| 2,679,644 | Lippel | May 25, 1954 |
| 2,693,593 | Crosman | Nov. 2, 1954 |
| 2,708,748 | Straube | May 17, 1955 |
| 2,729,811 | Gloess | Jan. 3, 1956 |
| 2,736,881 | Booth | Feb. 28, 1956 |
| 2,790,160 | Millership | Apr. 23, 1957 |